United States Patent [19]

Akiya

[11] Patent Number: 4,599,137
[45] Date of Patent: Jul. 8, 1986

[54] METHOD OF FORMING RESIST PATTERN

[75] Inventor: Hideo Akiya, Isehara, Japan

[73] Assignee: Nippon Telegraph and Telephone Corp., Tokyo, Japan

[21] Appl. No.: 721,305

[22] Filed: Apr. 9, 1985

[30] Foreign Application Priority Data

Apr. 11, 1984 [JP] Japan .................................. 59-72253

[51] Int. Cl.[4] ........................ B44C 1/22; C03C 15/00; C03C 25/06; B29C 17/08
[52] U.S. Cl. .................................. 156/643; 156/646; 156/652; 156/655; 156/661.1; 156/904; 204/192 E; 427/41; 427/43.1; 430/296; 430/312; 430/313
[58] Field of Search .................... 427/38, 39, 41, 43.1; 430/296, 312, 313; 156/643, 646, 652, 655, 659.1, 661.1, 904; 204/192 E; 252/79

[56] References Cited

U.S. PATENT DOCUMENTS

| 4,244,799 | 1/1981 | Fraser et al. | 204/192 E |
| 4,389,281 | 6/1983 | Anantha et al. | 156/661.1 X |
| 4,481,049 | 11/1984 | Reichmanis et al. | 156/904 X |

Primary Examiner—William A. Powell
Attorney, Agent, or Firm—Frishauf, Holtz, Goodman & Woodward

[57] ABSTRACT

A method of forming a resist micropattern in the manufacture of semiconductor devices. This method comprises first forming a multilayered resist films on a substrate, the uppermost film of which is selected to be a highly sensitive resist film 0.05 to 1.0 μm in thickness, forming an uppermost resist pattern including a desired patterned groove, forming a mask film only in the groove, and dry etching the resist excluding that beneath the mask film in the groove thereby forming a resist micropattern.

11 Claims, 13 Drawing Figures

METHOD OF FORMING RESIST PATTERN

BACKGROUND OF THE INVENTION (1) Field of the Invention

The present invention relates to a method of forming a resist micropattern in the manufacture of semiconductor devices.

(2) Description of the Prior Art

The packing density of seminconductor ICs has been greatly improved along with development of micropatterning. A micropattern on the order of one micron is utilized in VLSIs represented by 256-Kb DRAMs. A submicron patterning technique is required for megabit VLSIs. Conventional lithographic techniques present the following problems when used to form such a micropattern.

Surface roughness of a substrate presents a first problem. According to the conventional lithographic technique, a single resist film is formed on the substrate. Proper exposure and development are performed in accordance with the conditions (e.g., a film thickness) of the resist film, thereby obtaining a predetermined pattern. However, on an LSI substrate having many microprojections and microrecesses, a film thickness varies from place to place, or the film surface becomes uneven. Therefore, optimal exposure and development conditions vary from place to place, and uniform micropatterning throughout the entire surface of a substrate cannot be obtained. In order to overcome this, a thickness of the resist film is set to be considerably larger than heights of steps, thereby decreasing the degree of difference in film thickness over a substrate surface. However, when the resist film has a large thickness, resolution of the pattern is degraded due to defocusing during exposure and swelling during development, and micropatterning cannot be properly performed. Therefore, an increase in thickness of the resist film will exert bad effect on the formation of submicron micropattern.

Second, dry etching resistance of the resist pattern is also an important factor in forming submicron micropatterns. In a process of forming a micropattern in a substrate or various films for constructing electronic devices formed on a substrate, using a resist micropattern as a mask to etch the substrate or films for constructing electronic devices, the conventional wet etching methods using chemicals cannot be practical, since an undercut occurs by the etching. Therefore, a dry etching method using a gas plasma is now exclusively used for the formation of such a micropattern. Although the dry etching method has good reproducibility of the pattern size, a resist material containing an organic polymer as a major constituent tends to be easily etched. In order to maximize reproducibility, the resist film thickness must be sufficiently large, and a film must be exposed and developed to obtain a substantially vertically etched side surface. However, an increase in thickness of resist film would conflict with the improvement of micropatterning as described above.

Third, another conventional drawback is associated with exposure techniques. For example, in photoexposure using ultraviolet rays, submicron patterning is regarded as impossible in practice due to a diffraction limit based on wavelength of ultraviolet rays. Electron beam exposure and X-ray exposure have recently received a great deal of attention. Various resist materials are available for electron beam exposure and X-ray exposure. However, there are few resist materials which satisfy high resolution and high sensitivity requirements. A typical example is a positive type copolymer of fluorobutylmethacrylate and glycidylmethacrylate (FBM-G). Such a resist material is thermally unstable and has poor dry etching resistance described above as the second problem and cannot be used in practice.

The conventional problems indicate that it is very difficult to obtain an optimal photoresist film thickness which is suited for the exposure and etching processes when the micropattern becomes higher in fineness and density.

In order to solve the above conventional problems, a multilayer resist technique is known (e.g., see U.S. Pat. No. 4,244,799). A thick layer underlayer resist is coated on a substrate to absorb the unevenness of the surface of the substrate, an intermediate layer made of a material (e.g., $SiO_2$) having good etching selectivity with respect to the underlayer resist is formed on the underlayer resist, and a toplayer resist having good resolution is formed on the intermediate layer. A desired circuit pattern is formed on the toplayer resist to form a toplayer pattern. By using the toplayer pattern as a mask, the intermediate layer is etched by reactive ion etching (RIE). By using the intermediate layer pattern as a mask, the underlayer resist is then etched by RIE.

According to this conventional technique, however, the number of steps is increased, and the entire process is complicated, thus limiting automation of a processing apparatus. In addition to these disadvantages, when a low heat resistant, material is used as a toplayer resist, dry etching conditions of the intermediate layer become critical. Furthermore, when a lower portion of the toplayer resist remains unremoved after a development process due to changes in lithographic conditions, etching of the intermediate layer is adversely affected, thereby requiring critical control of the entire etching process.

It is therefore desired to develop a novel method of forming a resist pattern, which can be carried out without worrying about the low resistance of a high sensitive resist material.

SUMMARY OF THE INVENTION

It is an object of the present invention to solve the conventional drawbacks described above and to provide a method of easily forming a resist micropattern with high efficiency and high precision.

Another object of the present invention is to provide a method of forming a resist pattern which allows the utilization of a low-dry etching resistivity and high sensitivity resist material as an uppermost resist layer.

In order to achieve the above object of the present invention, there is provided a method of forming a resist pattern, comprising the steps of:

(a) sequentially forming a plurality of resist films on a substrate, including a highly sensitive resist film having relatively low etching resistance properties, the highly sensitive resist film being formed as an uppermost resist layer;

(b) forming an uppermost resist pattern including a desired patterned groove in the uppermost resist layer such that the groove substantially extends through the uppermost resist layer;

(c) forming an etching mask film on an entire exposed surface including a surface of the uppermost resist pattern;

(d) forming a mask pattern, which is complemental to said uppermost resist pattern, by partially removing the etching mask film to leave the etching mask film only in the patterned groove; and (e) forming a resist pattern by etching a portion of the plurality of resist films excluding a mask region by using the etching mask pattern as a mask.

This resist pattern formed by the above method is utilized to treat an underlying film such as semiconductor substrate.

According to the method of the present invention, a resist material which is thermally unstable, but highly sensitive to high energy beams such as light, X-rays, electron beams and ion beams can be used as the uppermost resist layer (i.e., an exposed layer) without trouble. The highly sensitive resist material is selected from a fluorobutylmethacrylate glycidylmethacrylate copolymer (FBM-G), polyhexafluorobutylmethacrylate (FBM) and polydimethyl tetrafluoropropylmethacrylate (FPM).

The thickness of the uppermost resist layer is preferably as small as possible and falls within the range of 0.05 µm to 1 µm.

The resist layers under the uppermost resist layer are not otherwise limited as far as they can be properly etched by dry etching. The thickness of these resist layers can be large enough to absorb the roughness of the substrate. Such an underlayer material is selected from chloromethylated polystyrene (CMS), polystyrene, phenylmethacrylate/methacrylic acid copolymer, polymethylmethacrylate (AZ-1350), novolak resin (OFPR, Tokyo Ohka Kogyo) and polyimide.

A techique for leaving the etching mask film only in the patterned groove of the uppermost resist pattern in step (d) comprises (i) depositing the etching mask material by spin coating to fill the pattern groove, so as to make flat the surface of the etching mask material and etching the etching mask layer until the projecting surface of the uppermsot layer is exposed; or (ii) (liftoff technique) depositing an etching mask material by an anisotropic film deposition method such as an electron cyclotron resonance plasma technique to cover the entire surface including the patterned groove, selectively etching the film deposited on the side surfaces of the pattered groove by taking advantage of its easy etching property, and etching the etching mask material layer deposited on the projecting surface of the uppermost resist layer together with the projected underlying uppermost resist layer portion.

The etching mask material to be filled in the patterned groove is selected from an organic silicone compound, low-melting glass, and etc. in technique (i); or $SiO_2$, amorphous silicon, silicon nitride and amorphous carbon in technique (ii).

DETAILED DESCRIPTION OF THE PREFERRED EMBODIMENTS

Figure 1A:
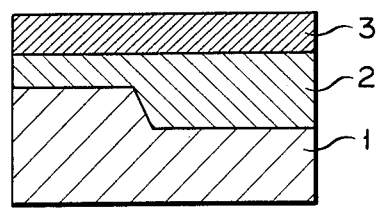
FIGS. 1A to 1F are respectively sectional views for explaining the steps in forming a multiplayer resist pattern according to an embodiment of the present invention.
Figure 1D:
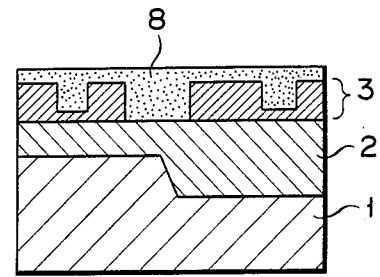
Figure 1B:
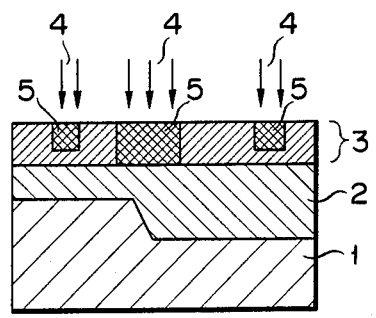
Figure 1E:
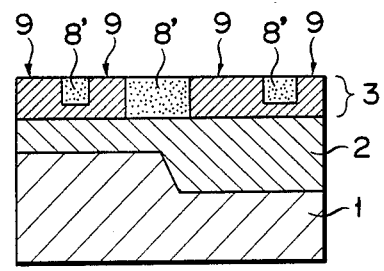
Figure 1C:
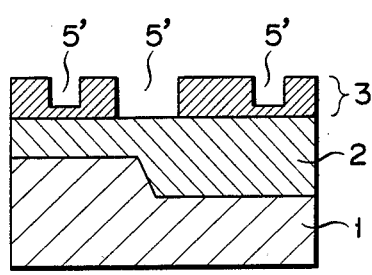
Figure 1F:
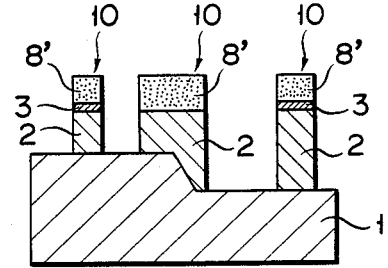

The present invention will be described in detail by way of the examples below.

EXAMPLE 1

FIGS. 1A to 1F are respectively sectional views for explaining the steps in forming a multilayer resist pattern. In step (A) (FIG. 1A), a chloromethylated polystyrene (CMS) layer 2 as a first resist film was formed on a substrate 1 with step to a relatively large thickness so as to obtain a flat surface. The layer 2 was baked at a temperature of 200° C. for 25 minutes and hardened by $CF_4$ plasma treatment. An FBM-G layer 3 as a second resist film (an uppermost resist layer) was spin coated on the layer 2 to a thickness of about 0.7 µm. In step (B) (FIG. 1B), a predetermined pattern was selectively exposed with an electron beam 4 to form a exposed region 5. Thereafter, in step (C) (FIG. 1C), the exposed region was dissolved by a predetermined developing solution to form a recess 5' corresponding to the exposure pattern. In step (C) (FIG. 1C), the depths of the recess 5' varied; a part of the recess 5' reached the boundary between the layers 2 and 3 and another did not reach the boundary. This result is based on the amount of light exposed and does not present any problem. Usually, the formation of the recess 5' in the layer 3 is conducted by suitably adjusting the exposure and development of the layer 3 so as to expose the resist layer 2. However, due to some fluctuations in the process conditions, some of the recess 5' are not formed deep enough to expose the layer 3. But this phenomenon will not cause any problem in the process of this invention. Subsequently, in step (D) (FIG. 1D), a silicone resin film 8 was applied by spin coating to a thickness of about 0.8 µm to obtain a flat surface. The film 8 was sufficiently dried and etched in a plasma of a $CF_4-O_2$ (20%) gas mixture for two minutes in step (E) (FIG. 1E) to expose a projecting surface 9 of the layer 3. An inverted pattern 8' complementary to the original FBM-G pattern was formed. The FBM-G and CMS resist portions exposed were etched by oxygen RIE using the pattern 8' as a mask in step (F) (FIG. 1F), thereby transferring the pattern. Therefore, an inverted multilayer resist pattern 10 complementary to the recess 5' of the original pattern was formed.

According to the method of this embodiment, the underlayer need not be dry-etched by using the second resist film defined to have the original pattern as a mask. Even a photoresist material having poor etching resistance can be used for the second resist film. Therefore, a high-resolution, high-sensitivity resist film suitable for formation of a micropattern, even it the etching resistance property thereof for dry etching is inferior, can be applied. Furthermore, the silicone resin material of the inverted pattern is not substantially etched by oxygen RIE or asher treatment which is normally used for etching a resist film. Therefore, when the silicone resin film is used as a mask to dry-etch the first resist film to transfer the pattern, sufficient etching selectively can be obtained. Further, since the first resist film can comprise CMS or AZ-1350 (available from Shipley Corp.) having relatively high resistance to etching, it is advantageous if the underlying substrate or film for constructing electronic devices is dry-etched using the final inverted multilayer resist pattern as a mask.

The original pattern formed in the second resist film need not be completely exposed or developed to reach the first resist film. This is because the thickness of the inverted pattern left to fill the recess is sufficient for the subsequent pattern transfer mask. When a positive type resist film is used, the thickness of the film removed by development is increased in accordance with an increase in amount of exposure light. The amount of light for exposing the original pattern can be minimized, therby shortening the exposure time. In addition, exposure and development conditions suitable for forming a pattern of desired size in a resist film having a predetermined thickness vary depending on the size of the pattern. However, according to the method of the present invention, the resist film need not be entirely removed along the direction of thickness. Therefore, a relatively large margin for exposure and development conditions can be provided as compared with the conventional method.

In the above embodiment, the inverted pattern formation film is applied by spin coating. However, spin coating results in different thicknesses of the film from place to place depending upon the pattern size. More particularly, a thickness of the film deposited in a narrow recess is larger than that in a wide recess. For this reason, when the inverted pattern is formed by etching the spin-coated film, a required mask thickness often may not be obtained in the wide recess. Example 2 is described to solve this problem.

EXAMPLE 2

Figure 2A:
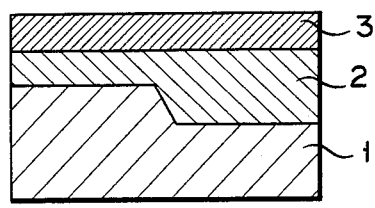
FIGS. 2A to 2G are respectively sectional views for explaining the steps in forming a multilayer resist pattern according to another embodiment of the present invention.
Figure 2B:
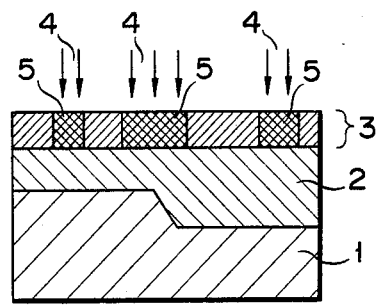
Figure 2C:
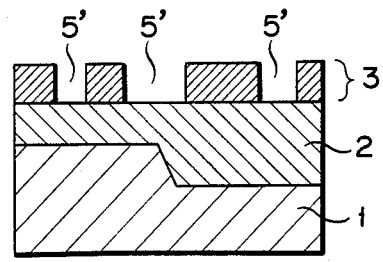
Figure 2D:
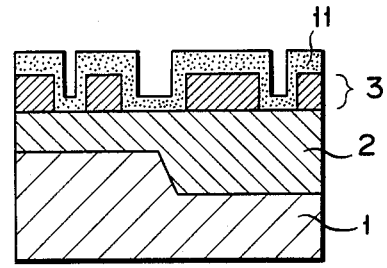
Figure 2E:
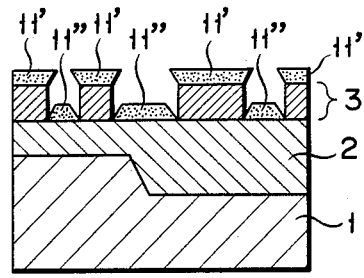
Figure 2F:
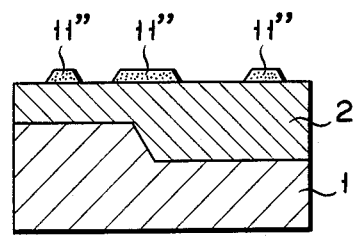
Figure 2G:
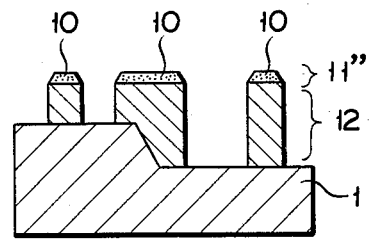

FIGS. 2A to 2G are respectively sectional views for explaining the steps in forming a multilayer resist pattern according to a second embodiment of the present invention. Steps (A) to (C) (FIG. 2A to 2C) are the same as those in Example 1. More particularly, a CMS resist film 2 as a first resist film was formed on a substrate 1, and a second FBM-G resist film 3 as a second resist film (an uppermost resist film) was formed on the film 2. The film 3 was exposed with an electron beam 4 and developed to form a recess 5' reaching the boundary between the first and second resist films 2 and 3. In step (D) (FIG. 2D), an SiO$_2$ film 11 was formed by ECR (Electron Cyclotron Resonance) plasma deposition to cover the entire surface to a thickness of about 0.1 μm. In this case, it is knwon that ionic bombardment strength in a direction perpendicular to the substrate surface affects the quality of the film deposited by ECR plasma deposition. In other words, as compared with a film deposited on a surface parallel to a substrate, a film deposited on vertical or oblique surfaces can be easily etched. By utilizing this fact, in step (D) (FIG. 2D), the resultant structure was dipped in a buffered hydrofluoric acid solution (a ratio of 50% hydrofluoric acid to a saturated aqueous solution of ammonium fluoride was 1:9 by volume) for seven seconds, or it was placed in a CF$_4$+O$_2$ (20%) plasma for 20 seconds, thereby selectively etching the film formed on the side surfaces of the original pattern, as shown in FIG. 2E. A film 11' on the projection of the original pattern was isolated from a film 11" formed on the film 2. In step (F) (FIG. 2F), the original pattern of the film 3 was dissolved in ethyl alcohol to remove the film 11', thereby leaving only the inverted pattern 11" complementary to the original pattern. Thereafter, in step (G) (FIG. 2G), an exposed portion of the film 2 was etched by oxygen RIE using the pattern 11" as a mask. The pattern was thus transferred to form an inverted multilayer resist pattern 10 complementary to the original pattern.

According to the method of the present invention, the thickness of the film for forming the inverted pattern is predetermined irrespective of the size of the recess of the original pattern. Therefore, unlike in Example 1, variations in thickness can be prevented. In addition, since ECR plasma deposition is used in Example 2, the films formed on the vertical and oblique surfaces can be easily etched to isolate the film portions on the original pattern projection and recess. Therefore, the thickness of the resist film need not be larger than that of the deposited film to vertically isolate the deposited film portions. For this reason, the thickness of the second resist film for exposing the original pattern image can be made thinner irrespective of the thickness of the deposited film, thus resulting in convenience for micropatterning.

According to the method of the present invention, since it is sufficient for the second resist film material to be capable of forming the three-dimensional original pattern by exposure and development, in addition to the positive type resist material shown in Examples 1 and 2, a negative type resist material can also be used. In addition, ion beams, X-rays or normal ultraviolet rays can be used in place of the electron beam to obtain the same effect as in Examples 1 and 2. In Examples 1 and 2, a two-layer resist film is used as a multilayer resist film. However, an intermediate material for simplifying stacking of different resist materials, and a protective material for protecting the substrate against the influence of radiation can be properly selected without departing from the gist of the invention, and thus a resist film consisting of three or more layers can be used. In addition, even when exposure and development effects reach the intermediate layer or the first resist film, passsing through the uppermost layer when a two-layer resist film is used, the effect of thepresent invention will not be impaired.

Even a high-sensitivity resist material having low resistance to dry etching can be used as an exposure layer, and if part of the bottom portion of the exposure layer is left slightly unremoved as a result of developing process, no problems occur. A large selection of resist materials is guaranteed, and conditions pertaining to stacking, film thickness adjsutment, exposure, development and transfer can be widened. The process itself can be simplified as compared with the conventional process, thus improving efficiency. Therefore, a micropattern having a width of 0.5 μm or less can be obtained with high precision.

What is claimed is:

1. A method of forming a resist pattern, comprising the steps of:
    (a) sequentially forming a plurality of resist films on a substrate, including a highly sensitive resist film having relatively low etching resistance properties, said highly senstive resist film being formed as an uppermost resist layer;
    (b) forming an uppermost resist pattern including a desired patterned groove in said uppermost resist layer such that said groove substantially extends through said uppermost resist layer;
    (c) forming an etching mask film on an entire exposed surface including a surface of said uppermost resist pattern;
    (d) forming a mask pattern, which is complemental to said uppermost resist pattern, by partially removing said etching mask film to leave said etching mask film only in said patterned groove; and (e) forming a resist pattern by etching a portion of said plurality of resist films excluding a mask region by using said etching mask pattern as a mask.

2. A method according to claim 1, wherein the step (c) comprises applying a liquid mask material to the entire surface by spin coating so as to make flat a surface of said mask material.

3. A method according to claim 2, wherein said liquid mask material comprises silicon resin.

4. A method according to claim 1, wherein the step (d) is performed by etching said etching mask film until an upper surface of said uppermost resist layer is exposed.

5. A method according to claim 1, wherein the step (b) is performed by a wet development.

6. A method according to claim 1, wherein the step (b) comprises etching said uppermost layer such that a lower portion thereof is left in at least a portion of said patterned groove.

7. A method according to claim 1, wherein the uppermost resist layer is formed 0.05 $\mu$m to 1.0 $\mu$m in thickness in the step (a).

8. A method according to claim 1, wherein the step (c) comprises applying silicone resin to the entire surface by spin coating, forming a flat surface of the silicone resin, and the step (d) is performed by etching said etching mask film until an upper surface of said uppermost resist layer is exposed, a fluorobutylmethacrylate-glycidylmethacrylate copolymer being used as the uppermost resist layer.

9. A method according to claim 1, wherein the step (c) is performed by an anisotropic vapor deposition method.

10. A method according to claim 9, wherein the vapor deposition method is an electron cyclotron resonance plasma deposition method.

11. A method according to claim 1, wherein the step (d) comprises exposing a wall surface of said patterned groove by selectively removing said etching mask film from said wall surface of said patterned groove, and leaving said uppermost resist layer and said etching mask film on said uppermost resist layer through the exposed wall surface.

* * * * *